(12) United States Patent
Rohleder et al.

(10) Patent No.: US 9,246,512 B2
(45) Date of Patent: Jan. 26, 2016

(54) ERROR CORRECTING DEVICE, METHOD FOR MONITORING AN ERROR CORRECTING DEVICE AND DATA PROCESSING SYSTEM

(75) Inventors: Michael Rohleder, Unterschleissheim (DE); Stefan Doll, Munich (DE); Rolf Schlagenhaft, Munich (DE); Timothy J. Strauss, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 177 days.

(21) Appl. No.: 13/988,821

(22) PCT Filed: Dec. 2, 2010

(86) PCT No.: PCT/IB2010/055549
§ 371 (c)(1),
(2), (4) Date: May 22, 2013

(87) PCT Pub. No.: WO2012/073071
PCT Pub. Date: Jun. 7, 2012

(65) Prior Publication Data
US 2014/0189462 A1    Jul. 3, 2014

(51) Int. Cl.
*H03M 13/05* (2006.01)
*G06F 11/10* (2006.01)
*G06F 11/07* (2006.01)

(52) U.S. Cl.
CPC ........... *H03M 13/05* (2013.01); *G06F 11/0754* (2013.01); *G06F 11/0757* (2013.01); *G06F 11/0766* (2013.01); *G06F 11/0772* (2013.01); *G06F 11/1048* (2013.01)

(58) Field of Classification Search
CPC ............ G06F 11/1048; G06F 11/0766; G06F 11/0757; G06F 11/0772; G06F 11/0754; H03M 13/05
USPC .................. 714/703, 746, 752, 774, 786, 799
See application file for complete search history.

(56) References Cited

U.S. PATENT DOCUMENTS

| | | | | |
|---|---|---|---|---|
| 4,296,494 A | * | 10/1981 | Ishikawa et al. | 714/6.1 |
| 4,323,966 A | * | 4/1982 | Whiteside et al. | 714/1 |
| 4,403,263 A | * | 9/1983 | Kageyama et al. | 360/32 |
| 5,610,929 A | * | 3/1997 | Yamamoto | 714/785 |
| 5,883,903 A | * | 3/1999 | Higashitani | 714/710 |
| 6,052,818 A | * | 4/2000 | Dell et al. | 714/773 |
| 6,339,546 B1 | * | 1/2002 | Katayama et al. | 365/185.09 |

(Continued)

OTHER PUBLICATIONS

Kobayashi et al., Application of Erasure Error Correction to Concatenated Partial-Response Channel Code, 1999, IEEE, pp. 1627-1331.*

(Continued)

*Primary Examiner* — John J Tabone, Jr.

(57) ABSTRACT

An error correcting device is provided that has an input connectable to receive one or more data units, an error detection module arranged to identify a presence of one or more errors in a received data unit of the one or more data units and to provide an error detection signal for the received data unit, an error correction module arranged to perform an error correction processing on the received data unit and provide a corrected data unit, and a correction evaluation module arranged to perform a comparison of the received data unit with the corrected data unit and to generate a correction error signal depending on a result of the comparison and the error detection signal.

20 Claims, 3 Drawing Sheets

(56) References Cited

U.S. PATENT DOCUMENTS

| | | | |
|---|---|---|---|
| 7,404,133 B2* | 7/2008 | McClellan et al. | 714/750 |
| 8,196,011 B2* | 6/2012 | Izumita et al. | 714/758 |
| 8,356,239 B2* | 1/2013 | Moyer | 714/800 |
| 2003/0145270 A1 | 7/2003 | Holt | |
| 2004/0091273 A1 | 5/2004 | Brissette et al. | |
| 2004/0243887 A1 | 12/2004 | Sharma et al. | |
| 2006/0277444 A1* | 12/2006 | Holian et al. | 714/41 |
| 2007/0162826 A1* | 7/2007 | Major et al. | 714/763 |
| 2009/0249167 A1* | 10/2009 | Nakaigawa | 714/763 |
| 2009/0282308 A1* | 11/2009 | Gutsche et al. | 714/746 |
| 2010/0058125 A1* | 3/2010 | Chen et al. | 714/704 |
| 2010/0077281 A1* | 3/2010 | Bae et al. | 714/758 |
| 2010/0241930 A1* | 9/2010 | Chang et al. | 714/769 |
| 2010/0246286 A1* | 9/2010 | Kim et al. | 365/189.14 |
| 2010/0257432 A1* | 10/2010 | Resnick | 714/777 |
| 2010/0262894 A1* | 10/2010 | Swing et al. | 714/782 |
| 2011/0055660 A1* | 3/2011 | Dudeck et al. | 714/763 |
| 2011/0087932 A1* | 4/2011 | Sautter et al. | 714/703 |
| 2011/0107161 A1* | 5/2011 | Eguchi et al. | 714/721 |
| 2011/0107166 A1* | 5/2011 | Flautner et al. | 714/746 |
| 2014/0143632 A1* | 5/2014 | North et al. | 714/764 |

OTHER PUBLICATIONS

International Search Report and Written Opinion correlating to PCT/IB2010/05549 dated Sep. 1, 2011.

* cited by examiner

ERROR CORRECTING DEVICE, METHOD FOR MONITORING AN ERROR CORRECTING DEVICE AND DATA PROCESSING SYSTEM

FIELD OF THE INVENTION

This invention relates to an error correcting device, a method for monitoring an error correcting device and a data processing system.

BACKGROUND OF THE INVENTION

Error detection and error correction, which is detection of errors and reconstruction of the error-free original data from encoded data, are techniques that enable reliable delivery of digital data from a data source to a data sink over an error prone transmission channel. Error correction coding (ECC) for error detection and correction may e.g. be applied to a telecommunications system for communication between sender and receiver over a noisy communication channel and is also widely used in the industry to improve the integrity of stored information. ECC may also be applied in digital data processing systems, for example when transmitting data to a data processing device, for example a microcontroller unit (MCU) used for example in a safety critical system, e.g. of a vehicle. Many devices employ ECC protection of data stored in memories or registers to assert the integrity of this data, and to detect and, if possible, correct errors. Often ECC is also used to protect the transmission of data over a bus.

Error correction coding usually employs a forward error correction scheme wherein data can be reconstructed at the receiving side without a need for retransmitting parts of the data in the case of a transmission error. Data is encoded at the source side using an error correction code, which adds redundant additional information. This additional information is used at the receiving side for checking the incoming data and recovering the data with the highest probability to be the original or which can be clearly identified to be correct.

An ECC device or unit set up to detect and correct errors in received data at the receiving side helps increase likelihood of correctness of the received data, if error-free performance of the device can be guaranteed.

In order to improve reliability of the output of the ECC unit as well as functional safety of the ECC unit, the system may for example comprise one or more redundant ECC units processing the same data in parallel for comparison of results. Or in an integrity check mode test data may be applied to the ECC unit for coverage of permanent faults and processed data may be output through an interface for external correctness evaluation. Transient errors may be detected by comparison approaches.

SUMMARY OF THE INVENTION

The present invention provides an error correcting device, a method for monitoring an error correcting device and a data processing system as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated, for the understanding and appreciation of the underlying concepts of the present invention and in order not to obfuscate or distract from the teachings of the present invention.

Figure 1:
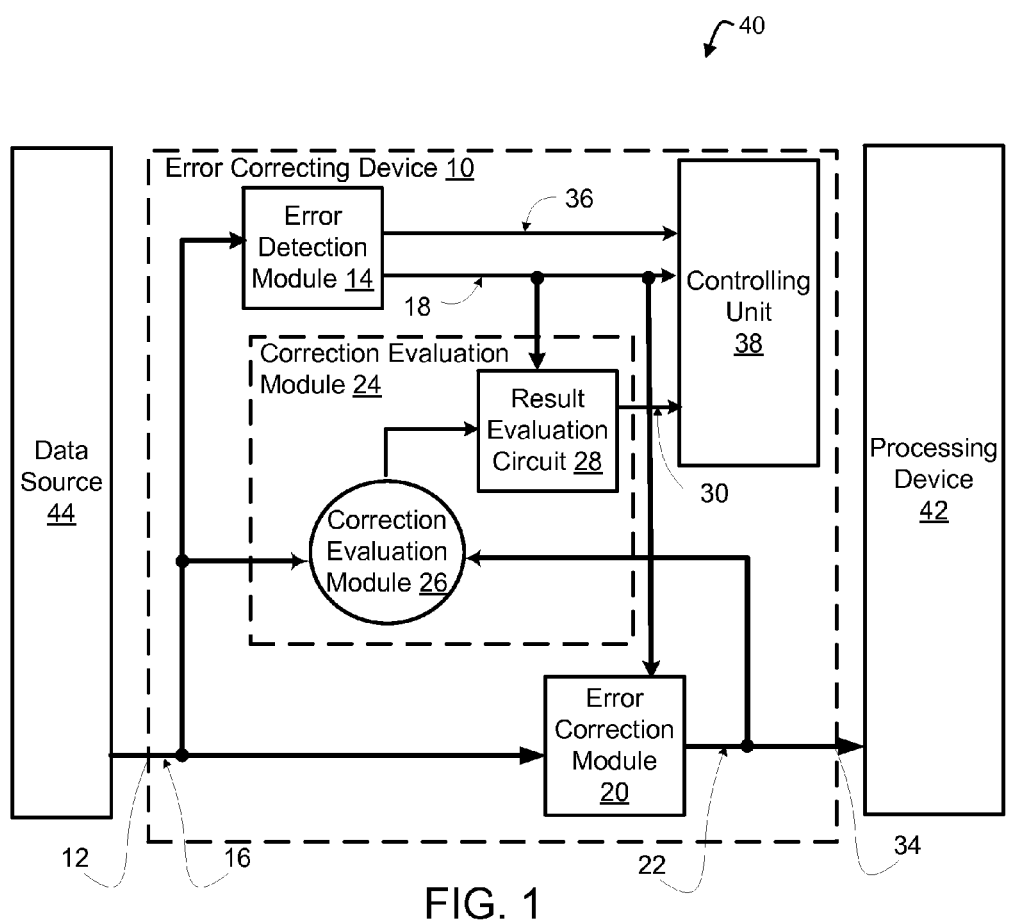
FIG. 1 schematically shows a block diagram of an example of a first embodiment of a data processing system comprising an error correcting device.

Referring to FIG. 1, a block diagram of an example of a first embodiment of a data processing system 40 comprising an error correcting device 10 is shown. An error correcting device 10 comprises an input 12 connectable to receive one or more data units, an error detection module 14 arranged to identify a presence of one or more errors in a received data unit 16 of the one or more data units and to provide an error detection signal 18 for the received data unit 16, an error correction module 20 arranged to perform an error correction processing on the received data unit 16 and provide a corrected data unit 22, and a correction evaluation module 24 arranged to perform a comparison of the received data unit 16 with the corrected data unit 22 and to generate a correction error signal 30 depending on a result of the comparison and the error detection signal 18.

A signal may be a time varying physical quantity, e.g. a varying voltage level, carrying information. A data unit may comprise a plurality of bits, for example a sequence or a frame of bits. An error may be an unintended change of signal level, such as a wrong bit level or value differing from the bit level of the original bit.

A received data unit 16 may comprise redundant bits added by error detection and correction encoding. For example, a forward error correction encoded data unit may comprise checksum bits. Other error correcting codes or channel coding techniques may be applied, for example Hamming codes, block codes, or Reed-Solomon codes, just to name a few.

The error correcting device 10 or error correction coding (ECC) decoder may be arranged to decode and evaluate the contained error information.

The error detection module 14 of the error correcting device 10 may for example comprise logic circuits and may be arranged to detect the presence and amount of erroneous bits within a data unit. The error detection signal 18 may be any suitable signal, and for example be a flag indicating the presence of either no error or of an amount of errors correctable or corrected by the error correction module 20. Also, the error detection signal 18 may directly indicate the number of errors contained in the received data unit 16 and/or comprise a plurality of signals using varying encoding. The error detection signal 18 may also be a set of bit positions indicating which bits of the received data unit 16 must be altered to achieve a correctly corrected data unit 22. The error detection module 14 may be capable of identifying single-bit and multi-bit errors.

The error correction module 20 may be arranged to process a received data unit 16, i.e. correct up to a correctable number of erroneous bits, and provide a corrected data unit 22 as the processing result. It will be apparent that when the received data unit 16 is without errors, the corrected data unit 12 will not differ from the received data unit 16 when the error correction is without any flaws.

In an embodiment of the error correcting device, the error detection signal 18 may comprise a set of signals corresponding to bit positions within a received data unit 16, indicating whether or not the corresponding bit is erroneous and may need to be flipped. This set of signals may be regarded as a set of selection bits. Here, the error correction module 20 may comprise a corresponding set of logic circuits, for example XOR circuits using these selection bits to flip the related bit position within the received data unit 16 in order to provide the corrected data unit 22.

A corrected data unit 22 may be identical to the original data unit provided by a data source 44. An erroneous correction processing result may still be called a corrected data unit, i.e. a corrected data unit 22 may be a data unit processed by the error correction unit 20, but may comprise errors in case of a wrong error correction.

The correction evaluation module 24 may for example comprise logic circuits and may be capable of identifying an erroneous error correction and may generate a correction error signal 30 in case of an identified erroneous correction. This identification may be achieved by comparing the received data against the corrected data produced, while taking into account the information provided by the error detection signal(s) 18 whether or not ECC correction may be required. The correction evaluation module 24 may comprise at least one comparator circuit 26 connected to receive the received data unit 16 and the corrected data unit 22. The module 24 may further comprise a result evaluation circuit 28 connected to receive a comparison result from the comparator circuit 26 and the error detection signal(s) 18. The circuit 28 can generate the correction error signal 30. The correction error signal 30 may indicate a false error correction for the corrected data unit 22 when an erroneous correction has been identified. This may for example be encoded in a signal level change of the error correction signal or as a dedicated signal level, where a second dedicated signal level may indicate an accepted error correction.

The error detection module 14, the error correction module 20 and the correction evaluation module 24 may for example comprise logic circuitry or logic circuits or other processing circuits to perform the described tasks.

Usually, the capability of error correction coding to not only identify errors, but also to correct them, makes an error correcting device 10 or ECC unit a potential source of harm in the case of malfunctioning, when an error within the ECC unit may result in generating erroneous data. Depending on the data units received, even seldom occurring wrong ECC correction may have a strong impact on the application using the data processing system 40 having the error correcting device 10, e.g. in case of application in a safety critical system. The shown example of an error correcting device 10 may allow fast and reliable detection of any malfunctioning, at least of the error correction module of the error correcting device itself. Unintended or incorrect error "correction" may be discovered "on the fly" during regular processing of received data units.

For example, the correction error signal may indicate a false correction and the correction evaluation module 24 may be arranged to provide a correction error signal 30. For example, the module 24 may provide the signal 30 when the error detection signal(s) 18 indicate(s) no error and the result indicates a difference between the received data unit 16 and the corrected data unit 22. The error correction module 20 may for example process error-free received data units 16 while changing the bits of the data units. Therefore, a difference between input and output of the error correction module 20 may indicate a wrong or unintended correction introduced by the error correction module 20. This may allow for detecting correction errors when e.g. receiving error-free data units. The output of the error correction module 20 may be observed continuously, for some or each data unit received at the input 12 of the error correcting device 10. This may allow for fast or immediate detection of malfunctioning of the error correction module 20. For many data processing systems, a broad coverage of errors introduced by the error correction module may be achieved.

The correction error signal 30 may also indicate that a false or erroneous correction is detected. The correction evaluation module 24 may be arranged to provide the correction error signal 30 when the error detection signal 18 indicates at least one correctable error and the result indicates that there is no difference (or at least no difference significant for the specific application) between the received data unit 16 and the corrected data unit 22, which may then be considered sufficiently similar. The correction evaluation module 24 may be able to detect that no correction has been applied to the received data unit 16 although the error detection module 14 detected at least one correctable error within the received data unit 16. This may allow for detecting correction errors when receiving an incorrect data unit. Also, the error detection module 14 may provide an incorrect error detection signal 18, which can thus be detected. Both cases may result in a correction error signal 30 indicating an error occurred within the error correcting device 10.

Figure 2:
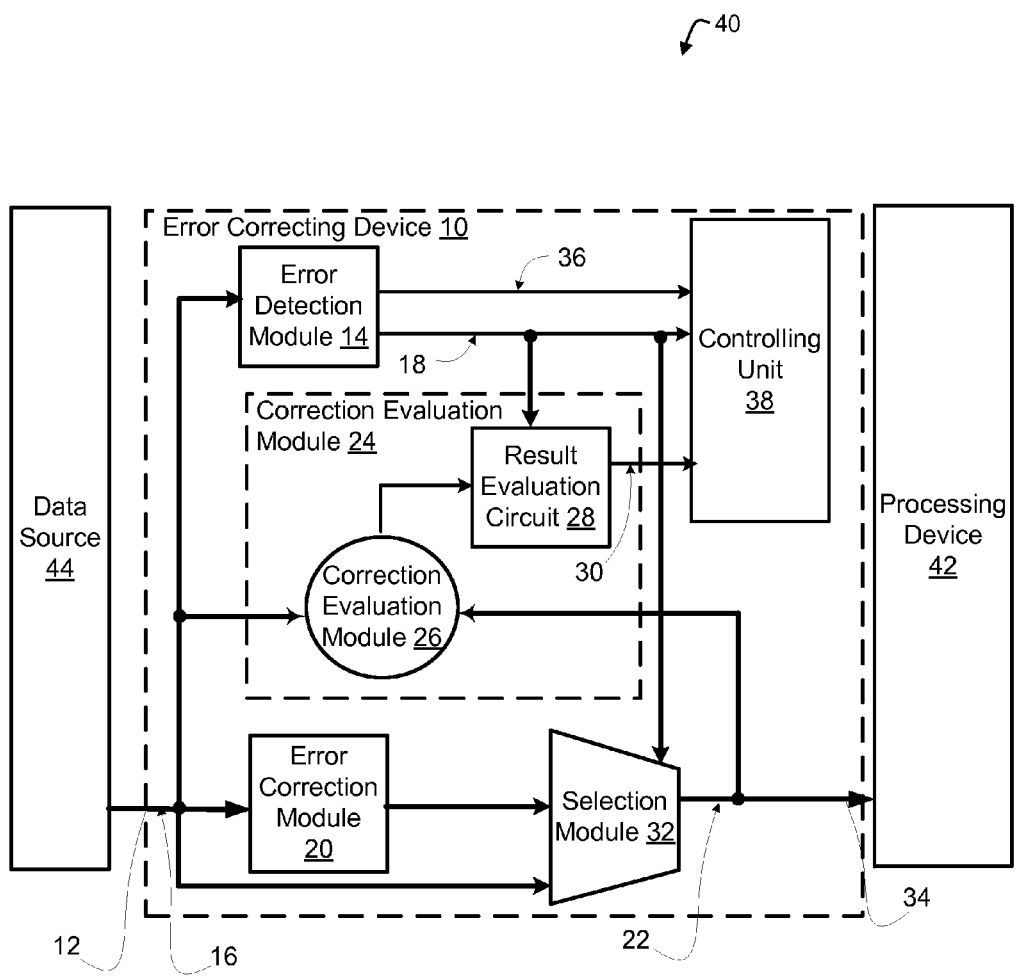
FIG. 2 schematically shows a block diagram of an example of a second embodiment of a data processing system comprising an error correcting device.

Referring to FIG. 2 a block diagram of an example of a second embodiment of a data processing system comprising an error correcting device is schematically shown. Only elements differing from, or not yet addressed in connection with, FIG. 1 will be described. The error correcting device 10 may comprise a selection module 32 connected to receive the error detection signal 18, the received data unit 16 and the corrected data unit 22 and arranged to provide the corrected data unit 22 to an output 34 of the error correcting device 10 when the error detection signal 18 indicates a correctable error. To limit the potential fault sources on the data path, the selection module 32 may be arranged to provide the received data unit 16 to the output 34 when the error detection signal 18 indicates that there is no error. As shown in FIG. 2, the selection module 32 may for example be a multiplexer module arranged to provide the corrected data unit 22 or the received data unit 16 to the output 34 depending on the error detection signal 18. This may allow disabling usage of corrected data units 22 in the case of no detected errors. This may allow providing the corrected data unit 22 to the correction evaluation module 24, and afterwards the received data unit 16 to the output 34.

The selection module may e.g. be implemented using a multiplexer module as described above. However, other circuits may be used additionally or instead, for example logic circuits such as an XOR (exclusive or) gate.

The selection module 32 may be switched depending on the error detection signal 18 and the correction error signal 30, allowing for providing the received data unit 16 instead of the corrected data unit 22 to the output 34 in case of an error-free received data unit 16 and an error introduced by the error correction module 20 into the corrected data unit 22.

The error detecting device 10 may detect an amount of errors higher than the number of errors that can be corrected by the error correction module 20. For example, depending on the chosen error correction code and code parameters, the code may allow correcting a number of bit-errors within a data unit and may allow detecting the same number or a higher number of errors. It can be distinguished between correctable and uncorrectable, i.e. non-correctable, errors. For example, depending on the chosen ECC, single-bit errors may be correctable errors, whereas double-bit and more errors may be uncorrectable errors. The error correction module may be capable to correct errors identified as being correctable.

The error detection module 14 may be arranged to provide an uncorrectable-error-signal 36 when the received data unit 16 comprises more errors than the error correction module 20 is capable of correcting. Since in this case the corrected data unit 22 may still comprise errors, the data unit may be regarded invalid and this exceptional uncorrectable-error-signal 36 may be provided to a controller 38 for further processing. In another embodiment, no dedicated uncorrectable-error signal 36 may be used, but the error detection signal 18 may be arranged to signal at least three different informations: no error detected, correctable error(s) detected, and uncorrectable errors detected.

As shown in FIG. 1 and FIG. 2, the uncorrectable-error-signal 36 may be provided to the controlling module 38 or controller. The controlling unit 38 may be arranged to reset or re-initialize the error correcting device 10, or re-initiate transmission of data-units within the data processing system 40 or may forward (not shown) the uncorrectable-error alert to a processing device 42 for further error handling.

The controlling unit 38 may be part of the error correcting device 10 or connected to the device 10. In an embodiment of the error correcting device 10, the device 10 may comprise the controlling unit 38, which may or may not receive the uncorrectable-error-signal 36, connected to receive the correction error signal 30. The controlling unit 38 may be arranged to handle the correction error signal 30. This may for example comprise sending an alert signal to the processing device, resetting or disabling the error correction module 20. Any error handling may be applied immediately after an occurrence of a correction error or may be activated after a number of correction errors, for example within a certain time or consecutively one after another. Depending on the implemented way of correction error handling, the controlling unit 38 may comprise for example logic circuits or other processing or memory circuitry.

The controlling unit 38 may be arranged to receive the error detection signal 18 and control provision of the received error detection signal 18 to the selection module 32. The controlling unit arranged to receive the correction error signal 30 may be arranged to receive the error detection signal 18. This may allow the controlling unit 38 to determine the integrity of the corrected data unit.

The error correcting device 10 may be arranged to continuously receive a stream or sequence of data units. The device 10 may be arranged to provide an updated correction error signal 30 for each of the received data unit 16. This may allow monitoring performance of the error correcting device 10 or ECC unit continuously during its normal operation, without a need for switching into a test mode or providing correction results to an external evaluation unit through an interface for evaluation of the corrected data units. The error correcting device 10 may not need a test mode for receiving and processing well-known test data in order to verify correct operation or discover permanent faults of the error correcting device 10. The correction error detection may be applied during the whole time of operation, which may also enable detecting correction errors irregularly occurring as burst errors. The error correcting device 10 may give coverage for permanent and transient errors or faults.

The error correcting device 10 may for example be integrated in a single integrated circuit package, e.g. on a single die. It may for example be implemented as an ECC controller device. A data processing system 40 may for example comprise an ECC controller or for example a controller for controlling data communication within a data processing system 40, e.g. between a memory unit and a processing device, wherein the controller comprises the error correcting device.

Figure 3:
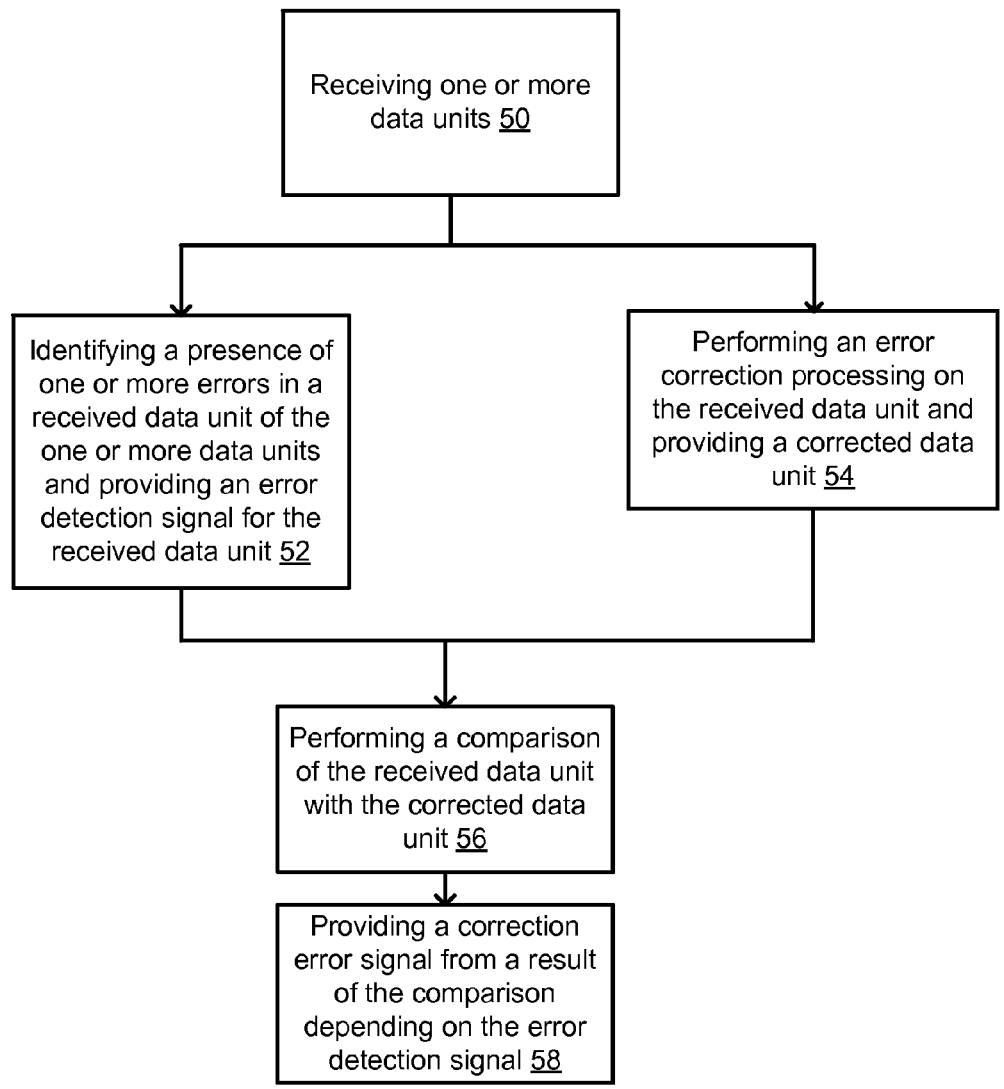
FIG. 3 schematically shows a diagram of an example of an embodiment of a method for monitoring an error correcting device.

Referring now to FIG. 3, a diagram of an example of an embodiment of a method for monitoring an error correcting device is schematically shown. The method allows implementing the advantages and characteristics of the described error correcting device as part of a method for monitoring an error correcting device.

A method for monitoring an error correcting device comprises receiving 50 one or more data units, identifying 52 a presence of one or more errors in a received data unit of the one or more data units and providing an error detection signal for the received data unit, performing an error correction processing 54 on the received data unit and providing a corrected data unit, performing a comparison 56 of the received data unit with the corrected data unit, and providing 58 a correction error signal from a result of the comparison depending on the error detection signal.

In an embodiment of the method, the correction error signal may indicate a false correction and the providing 58 a correction error signal from a result of the comparison depending on the error detection signal may comprise providing the correction error signal when the error detection information indicates no error and the result indicates a difference between the received data unit and the corrected data unit.

Additionally or alternatively, the providing 58 a correction error signal from a result of the comparison depending on the error detection signal may comprise providing the correction error signal 30 when the error detection signal indicates at least one correctable error and the result indicates no difference between the received data unit and the corrected data unit.

The receiving 50 may comprise continuously receiving sequences of data units.

Referring again to FIG. 1 and FIG. 2, a data processing system 40 may comprise at least one error correcting device 10 as described above and a processing device 42 arranged to receive corrected or received data units from the at least one error correcting device 10. It should be noted that the processing device 42 can be arranged to receive corrected and received data units.

A processing device 42 may for example be an MCU, a microprocessor, a central processing unit (CPU), or a graphics processing unit (GPU), just to name a few.

The data processing system may comprise a data source 44 comprising an output connected to provide data units to an input 12 of the at least one error correcting device 10, which is arranged to employ ECC detection and correction. A data source 44 may for example be a memory device holding the original data units. The source 44 may also be another processing device, e.g. a data encoder, or a sender for transmitting data units. The error correcting device 10 may be connected to receive ECC protected data units from the data source 44 and to provide the corrected data units 22 to the processing device 42.

The error correcting device 10 may be a separate device, for example connected to data source and processing device. Or it may be integrated with the data source (for example as part of a controller for verifying correctness of the stored data before transmission). In another embodiment of the data processing system 40, the error correcting device may be integrated as part of the processing device. For any of these embodiments of data processing systems, the data processing system 40 may be integrated in a single integrated circuit die package, e.g. on a single die. The data processing system may be provided as a system-on-a-chip.

The data processing system 40 may for example be part of a safety critical system, wherein malfunctioning of the processing device, for example a safety-critical microprocessor, due to erroneous data may result in possibly dangerous situations. A safety critical system may for example be part of electronic equipment of a power plant or a vehicle. A vehicle may for example be a car, a plane, a ship, a helicopter etc. A safety critical system may for example comprise a data source, for example a memory device, and a processing device, for example a microcontroller unit.

An automotive or vehicle safety critical system may for example comprise an electronic control unit (ECU). An ECU is an electronic control unit which may for example control various aspects of an internal combustion engine's operation. An ECU may for example control the quantity of fuel injected into each cylinder, ignition timing, variable valve timing (VVT), and other peripherals. A safety critical system may be found in a non-automotive environment. Or an automotive safety critical system may be, for example, a car safety system. A safety critical system may comprise a seat position control system, lighting, airbags, windscreen wipers, immobilizers, electronic climate control, a brake system or an electrical steering system. A brake system may comprise, for example, an anti-lock braking system (ABS), an electronic brakeforce distribution system (EBD), etc. An electrical steering system may comprise, for example, an electronic stability control system (ESC), a traction control system (TCS) or anti-slip regulation system (ASR), an adaptive cruise control (ACC) system, a forward collision warning (FCW) system etc.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices.

Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connections that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the error correction module 20 and the error detection module 14 may be implemented as one module.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the error correcting device 10 and the processing device 42 may be located on a single integrated circuit. Alternatively, the examples may be implemented as any number of separate integrated circuits or separate devices interconnected with each other in a suitable manner. For example, the error correcting device 10 may be a separate device interconnected with the processing device 42.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. An error correcting device, comprising
an input configured to receive one or more data units;
an error detection module arranged to:
    detect whether a received data unit includes a presence of one or more errors; and
    generate and provide an error detection signal for said received data unit, the error detection signal to indicate the presence of no errors in said received data unit, or the presence of one or more errors in said received data unit;
an error correction module arranged to:
    perform an error correction processing on said received data unit; and
    generate a corrected data unit;
a correction evaluation module arranged to:
    perform a comparison of said received data unit with said corrected data unit; and
    generate a correction error signal depending on a result of said comparison and said error detection signal; and
a selection module to:
    receive said error detection signal, said received data unit and said corrected data unit,
    provide said corrected data unit to the output of said error correcting device when said error detection signal indicates a correctable error, and
    provide said received data unit instead of said corrected data unit to the output in response to the error detection signal indicating that an error-free received data unit is detected, and in response to an error being introduced during said error correction processing performed by said error detection module.

2. The error correcting device as claimed in claim 1, wherein said correction error signal indicates a false correction and said correction evaluation module is arranged to provide said correction error signal when said error detection signal indicates no error and said result indicates a difference between said received data unit and said corrected data unit.

3. The error correcting device as claimed in claim 1, wherein said correction evaluation module is arranged to provide said correction error signal when said error detection signal indicates at least one error and said result indicates that said received data unit and said corrected data unit are sufficiently similar.

4. The error correcting device as claimed in claim 1, wherein said selection module is arranged to provide said received data unit to said output when said error detection signal indicates no error.

5. The error correcting device as claimed in claim 1, wherein said error detection module is arranged to provide an uncorrectable-error-signal when said received data unit comprises more errors than said error correction module is capable of correcting.

6. The error correcting device as claimed in claim 1, further comprising a controlling unit configured to receive said correction error signal.

7. The error correcting device as claimed in claim 6, wherein said controlling unit is configured to receive said error detection signal.

8. The error correcting device as claimed in claim 1, wherein said error correcting device is arranged to continuously receive sequences of data units.

9. The error correcting device as claimed in claim 1, wherein said error correcting device is integrated on a single integrated circuit die.

10. A method for monitoring an error correcting device, comprising
  receiving one or more data units;
  identifying where a received data unit of the said one or more data units is error-free or includes a presence of one or more errors;
  providing an error detection signal for said received data unit, the error detection signal indicating that the received data unit is error-free, or that the received data unit includes one or more errors;
  performing an error correction processing on said received data unit and providing a corrected data unit;
  performing a comparison of said received data unit with said corrected data unit;
  providing a correction error signal from a result of said comparison depending on said error detection signal;
  receiving, at a selection module, said error detection signal, said received data unit and said corrected data unit;
  providing, by said selection module, said corrected data unit to the output of said error correcting device when said error detection signal indicates a correctable error; and
  providing, by said selection module, said received data unit instead of said corrected data unit to the output in response to the error detection signal indicating that an error-free received data unit is detected, and in response to an error being introduced during said error correction processing.

11. The method as claimed in claim 10, wherein said correction error signal indicates a false correction and said providing a correction error signal from a result of said comparison depending on said error detection signal comprises providing said correction error signal when said error detection information indicates no error and said result indicates a difference between said received data unit and said corrected data unit.

12. The method as claimed in claim 10, wherein said receiving comprises continuously receiving sequences of data units.

13. The method of claim 10, further comprising:
  providing, by said selection module, said received data unit to said output when said error detection signal indicates no error.

14. A data processing system, comprising:
  at least one error correcting device comprising
    an input configured to receive one or more data units,
    an error detection module configured to identify either a presence of one or more errors in a received data unit of the one or more data units, or that the received data unit is error-free, to generate an error detection signal for the received data unit in response to said identifying, the error detection signal to indicate either the presence or one or more errors in the received data unit or that the received data unit is error-free, to perform an error correction processing on the received data unit, and to generate a corrected data unit, and
    a correction evaluation module configured to perform a comparison of the received data unit with the corrected data unit, and to generate a correction error signal depending on a result of the comparison and the error detection signal;
  a processing device arranged to receive corrected or received data units from said at least one error correcting device; and
  a selection module to:
    receive said error detection signal, said received data unit and said corrected data unit,
    provide said corrected data unit to the output of said error correcting device when said error detection signal indicates a correctable error, and
    provide said received data unit instead of said corrected data unit to the output in response to an error-free received data unit being detected, and in response to an error being introduced during said error correction processing performed by said error detection module.

15. The data processing system as claimed in claim 14, comprising a data source comprising an output connected to provide data units to an input of said at least one error correcting device.

16. The data processing system as claimed in claim 14, wherein said data processing system is integrated in a single integrated circuit package with at least one die.

17. The data processing system as claimed in claim 14, wherein the correction error signal indicates a false correction and said correction evaluation module is arranged to provide said correction error signal when said error detection signal indicates no error and said result indicates a difference between said received data unit and said corrected data unit.

18. The data processing system as claimed in claim 14, wherein the correction evaluation module is further configured to provide the correction error signal when the error detection signal indicates at least one error and the result indicates that the received data unit and the corrected data unit are sufficiently similar.

19. The data processing system as claimed in claim 14, wherein the error detection module is configured to provide an uncorrectable-error-signal when the received data unit comprises more errors than the error correction module is capable of correcting.

20. The data processing system of claim 14, wherein said selection module is arranged to provide said received data unit to said output when said error detection signal indicates no error.

* * * * *